(12) United States Patent
Zanbaghi et al.

(10) Patent No.: US 11,791,779 B2
(45) Date of Patent: Oct. 17, 2023

(54) ANALOG CIRCUIT DIFFERENTIAL PAIR ELEMENT MISMATCH DETECTION USING SPECTRAL SEPARATION

(71) Applicant: Cirrus Logic International Semiconductor Ltd., Edinburgh (GB)

(72) Inventors: Ramin Zanbaghi, Austin, TX (US); John L. Melanson, Austin, TX (US); Edmund M. Schneider, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 487 days.

(21) Appl. No.: 17/119,228

(22) Filed: Dec. 11, 2020

(65) Prior Publication Data
US 2022/0190789 A1 Jun. 16, 2022

(51) Int. Cl.
*H03M 1/12* (2006.01)
*H03F 1/56* (2006.01)
*H03F 3/45* (2006.01)

(52) U.S. Cl.
CPC ........... *H03F 1/56* (2013.01); *H03F 3/45475* (2013.01); *H03M 1/12* (2013.01); *H03F 2200/129* (2013.01); *H03F 2203/45116* (2013.01)

(58) Field of Classification Search
CPC .................................. H03M 1/12; H03F 1/56
See application file for complete search history.

(56) References Cited

U.S. PATENT DOCUMENTS

| | | | |
|---|---|---|---|
| 4,599,719 A | 7/1986 | Breen et al. | |
| 7,358,809 B2 | 4/2008 | Elder | |
| 9,876,518 B2* | 1/2018 | Kim | H04B 1/16 |
| 10,396,724 B1 | 8/2019 | Daigle et al. | |
| 11,621,683 B2* | 4/2023 | Xu | H03F 1/0227 |
| | | | 330/253 |
| 2008/0240301 A1* | 10/2008 | Mandal | H04B 1/1036 |
| | | | 375/340 |
| 2010/0290769 A1 | 11/2010 | Nasiri et al. | |
| 2011/0063146 A1 | 3/2011 | Matthews et al. | |
| 2014/0077873 A1* | 3/2014 | Motz | H03F 3/45977 |
| | | | 330/9 |
| 2014/0079098 A1* | 3/2014 | Harjani | H04B 7/0837 |
| | | | 375/219 |

(Continued)

OTHER PUBLICATIONS

Ray, Sourja et al. "A 13-b Linear, 40-MS/s Pipelined ADC with Self-Configured Capacitor Matching." IEEE Journal of Solid-State Circuits, vol. 42, No. 3, Mar. 2007. pp. 463-474.

*Primary Examiner* — Patricia T Nguyen
(74) *Attorney, Agent, or Firm* — E. Alan Davis; Huffman Law Group, PC

(57) ABSTRACT

A method for use in an analog circuit having a plurality of differential pairs of elements, wherein for each pair of the plurality of differential pairs of elements, the elements of the pair are designed to match but may have mismatch that induces error. The method includes, for each pair of at least two pairs of the plurality of differential pairs of elements: spectrally separating the mismatch-induced error of the pair from mismatch-induced error of a remainder of the plurality of differential pairs of elements, monitoring, by an analog-to-digital converter (ADC), an output of the analog circuit, and analyzing the monitored output to measure the mismatch-induced error of the pair.

24 Claims, 10 Drawing Sheets

(56) References Cited

U.S. PATENT DOCUMENTS

| | | | |
|---|---|---|---|
| 2014/0225591 A1* | 8/2014 | Knierim | H03M 1/121 |
| | | | 324/76.23 |
| 2020/0393529 A1* | 12/2020 | Larson | G01R 15/202 |
| 2021/0029319 A1 | 1/2021 | McFarland et al. | |
| 2021/0143835 A1* | 5/2021 | Gonzalez | H03M 3/496 |
| 2021/0356843 A1 | 11/2021 | Deo et al. | |
| 2022/0190789 A1 | 6/2022 | Zanbaghi et al. | |
| 2022/0321765 A1 | 10/2022 | Djadi et al. | |
| 2022/0329725 A1 | 10/2022 | Djadi et al. | |

* cited by examiner

ANALOG CIRCUIT DIFFERENTIAL PAIR ELEMENT MISMATCH DETECTION USING SPECTRAL SEPARATION

BACKGROUND

Analog circuits are commonly designed with pairs of differential circuit elements, e.g., resistors, capacitors, current sources. Often, the design relies on the elements of the differential pair to be a matched pair. If the elements of the pair do not match, then the analog circuit may not operate as desired, or may operate in a sub-optimal fashion. For example, if the resistance values do not match to a differential pair of input resistors of an analog gain stage, then an input offset of the gain stage may be introduced. The input offset may affect the performance of the analog gain stage and may affect the operation and performance of the system that includes the analog gain stage. For example, the performance of an audio amplifier may be affected by the offset input.

One conventional approach to reducing differential element pair mismatch is to "oversize" the elements. That is, the elements are designed to be larger than actually needed to perform the intended function. Oversizing tends to reduce the overall percentage by which the elements in the pair mismatch since the amount of mismatch is a smaller percentage of a larger element than a smaller element, and the reduced percentage of mismatch may reduce the effect of the mismatch on the performance of the analog circuit. However, the benefit of oversizing the pair elements may have the associated drawbacks of taking up more area of the integrated circuit, consuming more power and reducing the bandwidth of the circuit by increasing parasitic capacitance.

Another conventional approach to reducing differential element pair mismatch is to chop the pair of elements at a chopping frequency to move a mismatch-induced input offset (for example, that normally appears in the output frequency spectrum around DC (direct current), i.e., around zero frequency) to around the chopping frequency, and then filter out (e.g., via a low pass filter or a notch filter) the offset energy that was chopped up to the chopping frequency. However, a side effect of chopping is that energy in the input signal around the chopping frequency may be folded back to around DC within the output frequency spectrum. That is, input signal energy outside the frequency band of interest may undesirably get folded back into the output within the frequency band of interest. Thus, conventional chopping to reduce mismatch may not be an acceptable solution in some applications, particularly if the input signal energy spectrum makes it difficult to find an acceptable chopping frequency that does not introduce the fold-back problem.

SUMMARY

In one embodiment, the present disclosure provides a method for use in an analog circuit having a plurality of differential pairs of elements, wherein for each pair of the plurality of differential pairs of elements, the elements of the pair are designed to match but may have mismatch that induces error. The method includes, for each pair of at least two pairs of the plurality of differential pairs of elements: spectrally separating the mismatch-induced error of the pair from mismatch-induced error of a remainder of the plurality of differential pairs of elements, monitoring, by an analog-to-digital converter (ADC), an output of the analog circuit, and analyzing the monitored output to measure the mismatch-induced error of the pair.

In another embodiment, the present disclosure provides an apparatus that includes an analog circuit having a plurality of differential pairs of elements. For each pair of the plurality of differential pairs of elements, the elements of the pair are designed to match but may have mismatch that induces error. An analog-to-digital converter (ADC) is configured to monitor an output of the analog circuit. A controller is configured to, for each pair of at least two pairs of the plurality of differential pairs of elements spectrally separate the mismatch-induced error of the pair from mismatch-induced error of a remainder of the plurality of differential pairs of elements and analyze the monitored output to measure the mismatch-induced error of the pair.

In yet another embodiment, the present disclosure provides a method for use in an analog circuit having at least one differential pair of elements, wherein for each pair of the at least one differential pair of elements, the elements of the pair are designed to match but may have mismatch that induces error. The method includes measuring, using an analog-to-digital converter (ADC), a first value of the mismatch of the pair at a first chopping frequency. The method also includes measuring, using the ADC, a second value of the mismatch of the pair at a second chopping frequency distinct from the first chopping frequency. The method also includes measuring a chopping-induced error based on a difference between the first and second values of the mismatch of the pair.

DETAILED DESCRIPTION

Embodiments are described that reduce differential element pair mismatch without incurring the area and fold-back trade-offs associated with conventional solutions. Embodiments are described that spectrally separate the mismatch-induced error of the different differential element pairs from each other and measure the spectrally separated mismatch-induced errors of each individual pair and compensate for the measured mismatch-induced errors. Spectrally separating the mismatch-induced error of one pair from mismatch-induced error of the remainder of the pairs means causing the mismatch-induced error of the one pair to appear in the output of the analog circuit at a different frequency band than one or more frequency bands at which mismatch-induced error of the remainder of the pairs appears. The spectral separation may involve chopping pairs of the analog circuit in various manners, e.g., chopping the one pair and not chopping the other pairs, not chopping the one pair and chopping the other pairs, and chopping different pairs at different chopping frequencies. The mismatch may manifest itself as input offset of a gain stage of the analog circuit, for example. Chopping to measure mismatch-induced error may itself introduce a small amount of error in the mismatch-induced error measurement. Embodiments are described that measure the chopping-induced error. The mismatch-induced error is measured at two distinct chopping frequencies and a difference of the two mismatch-induced error measurements is taken. The difference is used as a basis for measuring the chopping-induced error.

Figure 1:
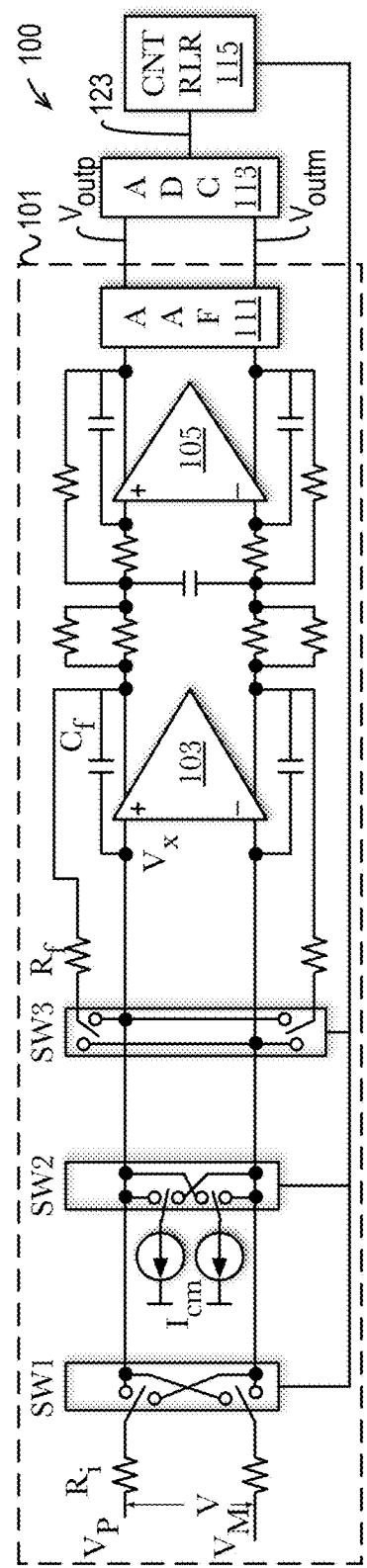
FIG. 1 is an example system that includes an analog circuit that has multiple differential element pairs in which the two elements in each pair are designed to match and that uses spectral separation to measure mismatch-induced error in the differential element pairs in accordance with embodiments of the present disclosure.

FIG. 1 is an example system 100 that includes an analog circuit that has multiple differential element pairs in which the two elements in each pair are designed to match and that uses spectral separation to measure mismatch-induced error in the differential element pairs in accordance with embodiments of the present disclosure. The system 100 includes the analog circuit 101 whose analog output $V_{out}$ (indicated as differential signals $V_{outp}$ and $V_{outm}$) is connected to the input of an analog-to-digital converter (ADC) 113 whose digital output 123 is connected to a controller 115. The analog circuit 101 includes a plurality of differential element pairs that are designed to match but which may have mismatches. Embodiments are contemplated in which mismatch-induced error may be measured for only a subset of all the differential element pairs of the analog circuit 101. The analog circuit 101 is configured with a chopping switch for each differential element pair whose mismatch-induced error is to be measured. In the example analog circuit 101 of FIG. 1, three chopping switches SW1, SW2 and SW3 are included for selectively chopping three respective differential element pairs: an input resistor pair $R_i$, a pull-down current source pair $I_{cm}$, and a feedback resistor pair $R_f$. That is, the chopping switches operate to swap, or alternate, the position of the two elements in the differential pair between the positive and negative positions in the differential circuit. The pull-down current source pair $I_{cm}$ may include matched transistors, for example.

In the example embodiment of FIG. 1, the analog circuit 101 may be employed as a current monitor circuit. For example, the current monitor may be employed to sense and measure a pulse-width-modulation (PWM) output current, or load current, driven through an output transducer (e.g., speaker) by a class-D amplifier, although the embodiments described are not limited to such an application but instead may be in any analog circuit, active or passive, that includes differential element pairs, such as an analog circuit including a gain stage. The current monitor analog front-end (AFE) chain includes an AFE gain stage, an anti-aliasing stage that includes an operational transconductance amplifier (OTA) 105, and an anti-aliasing filter (AAF) block 111 whose output $V_{out}$ is received by the ADC 113. The analog circuit 101 receives a differential input signal that is a voltage V that is a difference of respective positive and negative inputs $V_P$ and $V_M$.

The gain stage includes a differential operational transconductance amplifier (OTA) 103 having a summing node $V_X$ to which the input resistor $R_i$, pull-down current source $I_{cm}$, feedback resistor $R_f$, and feedback capacitor $C_f$ are connected. The input resistor $R_i$ and feedback resistor $R_f$ values set the signal gain of the gain stage. The pull-down current source $I_{cm}$ are used to level-shift the gain stage summing node voltages $V_X$. Mismatches in these elements may create a fully-differential frequency domain DC shift on the current monitor path and may also create a signal gain error. More specifically, mismatch of the differential input resistor pair $R_i$ and/or mismatch of the differential current source $I_{cm}$ of the gain stage may result in an input offset of the gain stage that may detrimentally affect the total harmonic distortion (THD) of the system 100. Additionally, mismatch of the differential feedback resistor pair $R_f$ of the gain stage may detrimentally affect the power supply rejection ratio (PSRR) of the system 100 and/or create non-linearities. These undesirable effects may change due to process-voltage-temperature (PVT) variations if they are not bounded.

Chopping switch SW1 operates to selectively connect the input resistor $R_i$ to the positive or negative summing node $V_X$; chopping switch SW2 operates to selectively connect the pull-down current source $I_{cm}$ to the positive or negative summing node $V_X$; and chopping switch SW3 operates to selectively connect the feedback resistor $R_f$ to the positive or negative summing node $V_X$. In the example of FIG. 1, mismatch within the input resistor $R_i$, pull-down current source $I_{cm}$, feedback resistor $R_f$, and feedback capacitor $C_f$ differential element pairs that are connected to the summing node $V_X$ of the gain stage may have a larger undesirable impact on performance of the system 100 since the gain stage mismatch-induced errors will not be attenuated, whereas mismatch-induced errors of other differential element pairs, e.g., of the anti-aliasing stage, will be attenuated by the gain of the gain stage. Stated alternatively, mismatch-induced errors at the gain stage will be gained up and may significantly impact the performance of the system 100. However, as described above, although chopping switches are included to spectrally separate and measure mismatch-induced errors of the three differential element pairs, other embodiments are contemplated in which the system 100 is configured to include chopping switches for different numbers of differential element pairs.

The current monitor in the system 100 is an example of an application in which the conventional chopping approach is not a good solution for reducing differential element pair mismatch because the nature of the input signal is such that it may be difficult to find an acceptable chopping frequency that does not fold back energy from the input signal back into the frequency band of interest. More specifically, the relatively high-frequency and high-power nature of the PWM load current that the system 100 is intended to measure may mean that there is significant energy at much of the frequency band of interest such that it may be difficult to find an effective chopping frequency for the conventional chopping method. However, advantageously, the embodiments described may be beneficially employed in such a system.

Figure 2:
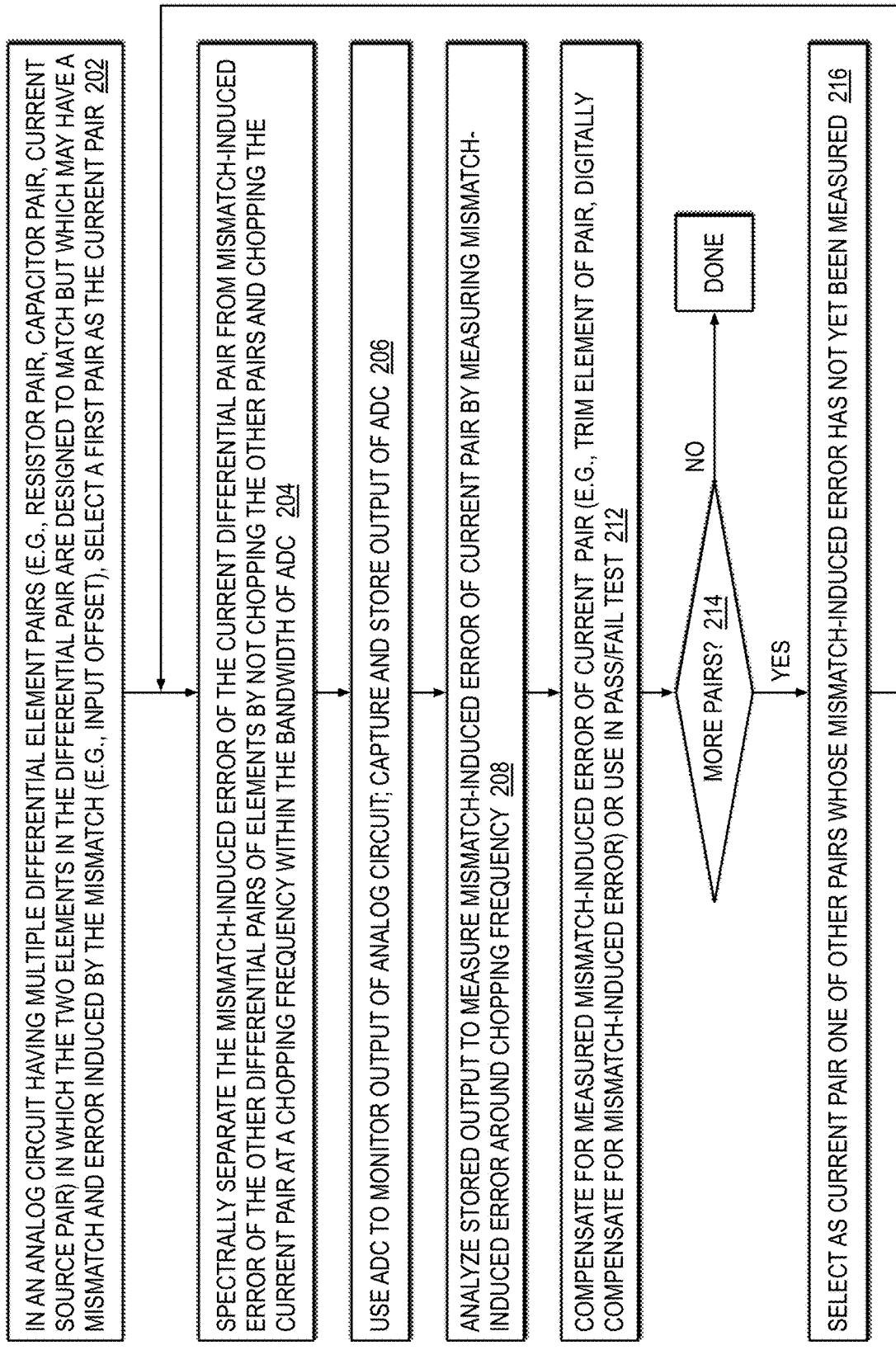
FIG. 2 is an example flowchart illustrating a method that uses spectral separation to measure a mismatch-induced error in a differential element pair in accordance with embodiments of the present disclosure.

FIG. 2 is an example flowchart illustrating a method, for use in a system having an analog circuit that has multiple differential element pairs in which each element in a pair is designed to match, that uses spectral separation to measure a mismatch-induced error in a differential element pair in accordance with embodiments of the present disclosure. The system 100 of FIG. 1 is an example of a system in which the method may be applied, although the method may be applied to measure differential element pair mismatch-induced error in any differential analog circuit. Operation begins at block 202.

At block 202, one of the differential element pairs is selected as the current pair whose mismatch-induced error is to be measured. For example, the input resistor $R_i$ pair may be selected as the current pair, although other pairs could be chosen. Operation proceeds to block 204.

Figures 3, 4:
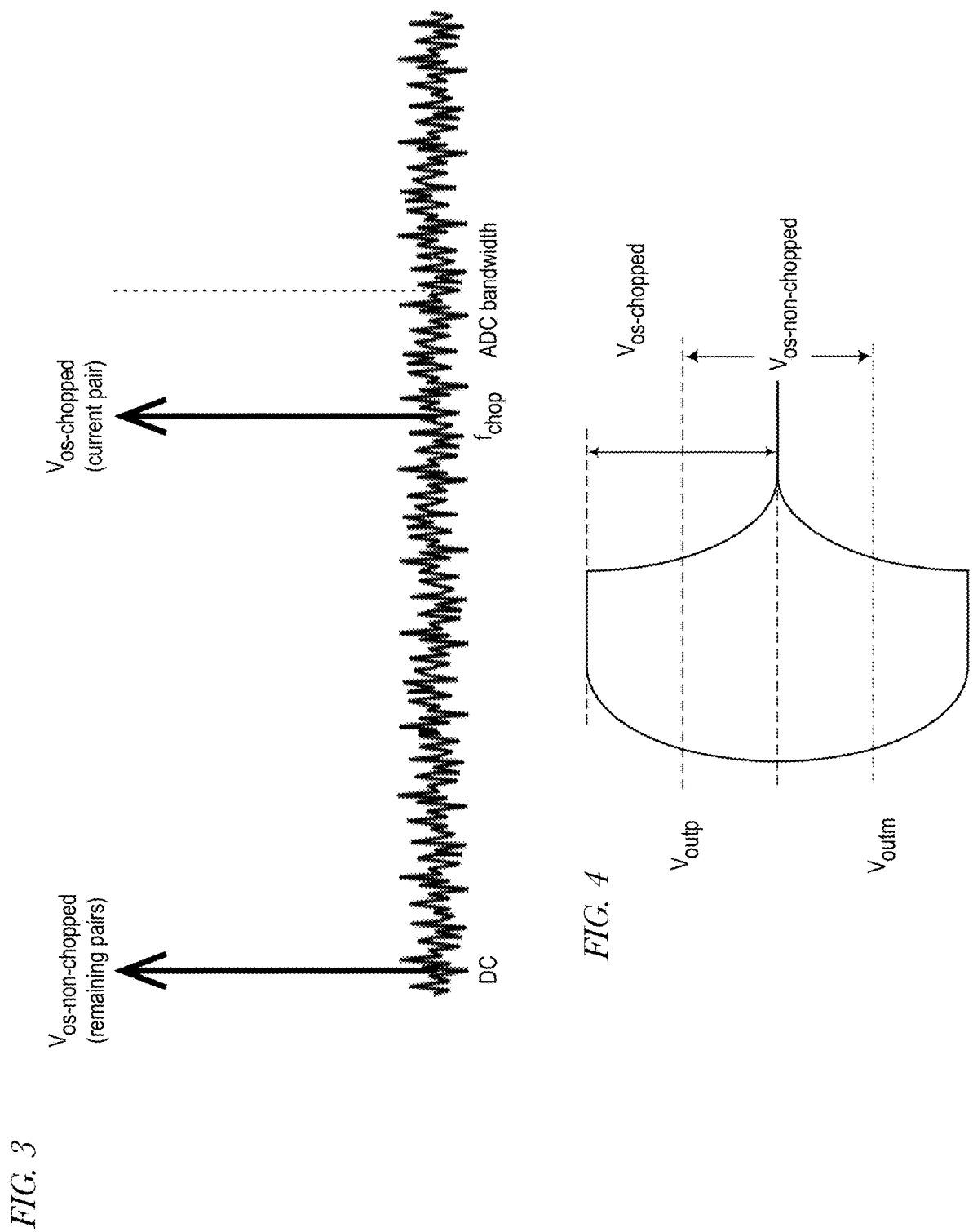
FIG. 3 is an example frequency spectrum graph illustrating operation of the method of FIG. 2.
FIG. 4 is an example output voltage graph illustrating operation of the method of FIG. 2.
Figure 5A:
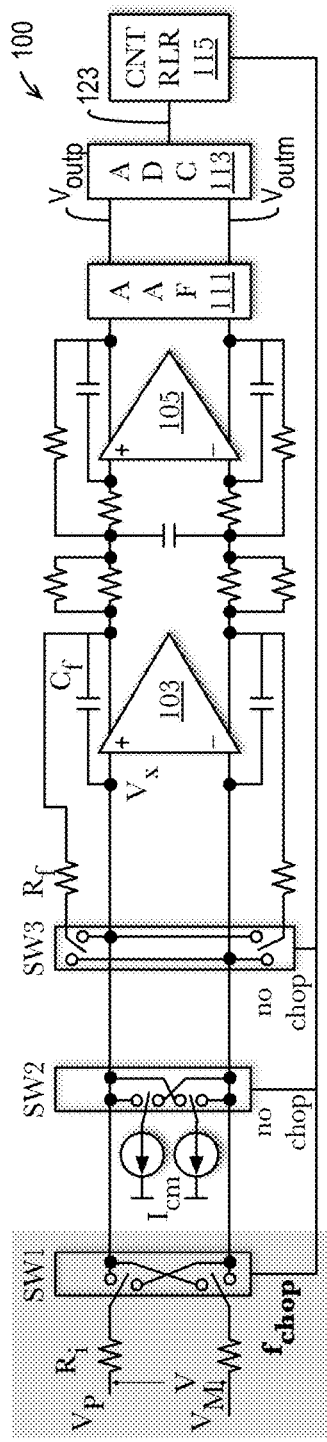
FIGS. 5A through 5C are examples of a system operating according to the method of FIG. 2.

At block 204, the mismatch-induced error of the current pair is spectrally separated from the mismatch-induced error of the remaining differential element pairs of the circuit by chopping the current pair and not chopping the remaining pairs. For example, if the input resistor $R_i$ pair is the current pair, then switch SW1 is operated at a chopping frequency whereas the other switches SW2 and SW3 corresponding to the current sources $I_{cm}$ and to the feedback resistor $R_f$ are not operated, i.e., they are kept in their default positions, as shown in FIG. 5A. The chopping frequency at which the current pair is chopped is a frequency that is within the measurement bandwidth of an ADC that monitors the output of the analog circuit while the spectral separation is being performed. Preferably, the input signal of the analog circuit (e.g., in the input voltage V of FIG. 1) is set to zero (e.g., $V_P$ and $V_M$ are tied to ground or to a power supply voltage) while the spectral separation is performed. As a result of the spectral separation of the mismatch-induced error of the current pair from the mismatch-induced errors of the remaining pairs, the current pair mismatch-induced error may be observed as a ripple at the analog circuit output around the chopping frequency used to chop the current pair, whereas the mismatch-induced errors of the remaining pairs remain as a frequency domain DC shift at the analog circuit output, as shown in FIGS. 3 and 4. The error may settle to its final value substantially within a time constant which, in the example of FIG. 1, may be the product of the feedback resistance and capacitance of the gain stage. Operation proceeds to block 206.

At block 206, the ADC monitors the output of the analog circuit, and the ADC output is captured and stored (e.g., in a memory accessible to a controller, e.g., controller 115 of FIG. 1, that captures the ADC output). Operation proceeds to block 208.

At block 208, the stored output is analyzed (e.g., by the controller 115 of FIG. 1) to measure the mismatch-induced error of the current pair. In one embodiment, a digital notch filter may be applied to the stored digital output around the chopping frequency used at block 204 to measure the mismatch-induced error of the current pair. In one embodiment, a Fast Fourier Transform (FFT) may be applied to the stored digital output to measure the mismatch-induced error of the current pair around the chopping frequency used at block 204. In one embodiment, a peak-to-peak measurement of the stored digital output may be observed to measure the mismatch-induced error of the current pair. Operation proceeds to block 212.

At block 212, the measured mismatch-induced error of the current pair is compensated. In one embodiment, the compensation comprises applying a calibration code to one of the elements of the pair, e.g., trimming a resistor, capacitor or current source transistor. In such embodiment, the calibration code may be stored based on the mismatch-induced error measured at block 208 during test of the system, and then the calibration code may be applied during normal operation of the system. Additionally, the compensation may be applied to the current pair prior to looping back to block 204 to measure the mismatch-induced error of the next differential element pair. In one embodiment, the compensation comprises digitally compensating for the mismatch-induced error. To illustrate by example, assume the measured mismatch-induced error is an input offset value caused by the current pair mismatch. The current pair input offset value may be stored during test of the system and subsequently, during normal operation of the system, subtracted from the ADC output. Additionally, the digital compensation may be applied to the current pair prior to looping back to block 204 to measure the mismatch-induced error of the next differential element pair. In another embodiment, the mismatch-induced error may be measured according to blocks 204 through 208 during normal operation and then the compensation may be performed. For example, if the chopping frequency is within the ADC bandwidth but outside the frequency band of interest, then the output may be low pass filtered and the mismatch-induced error may still be measured using the ADC and used to compensate. Alternatively, rather than compensating, the measured mismatch-induced error may be used to make a pass/fail determination during product test of an integrated circuit that includes the analog circuit. For example, if the mismatch-induced error exceeds a threshold, the integrated circuit may fail the test. Operation proceeds to decision block 214.

Figure 5B:
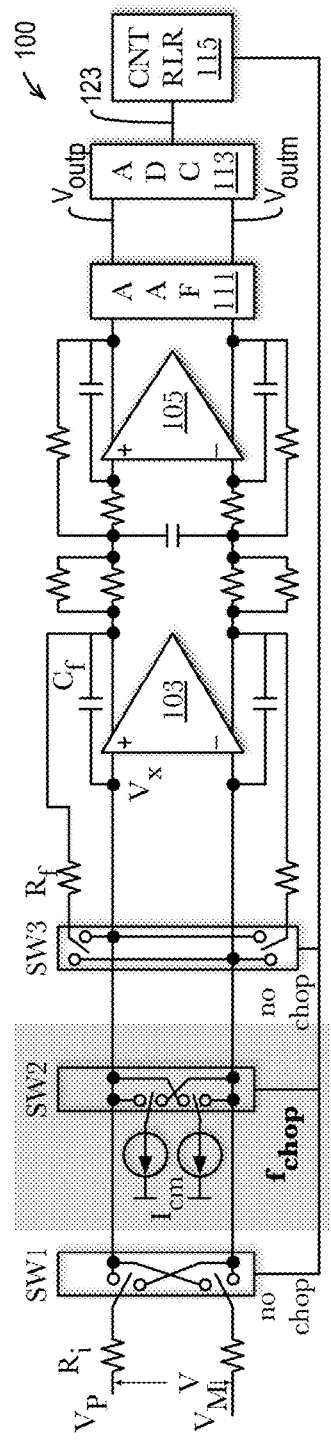
Figure 5C:
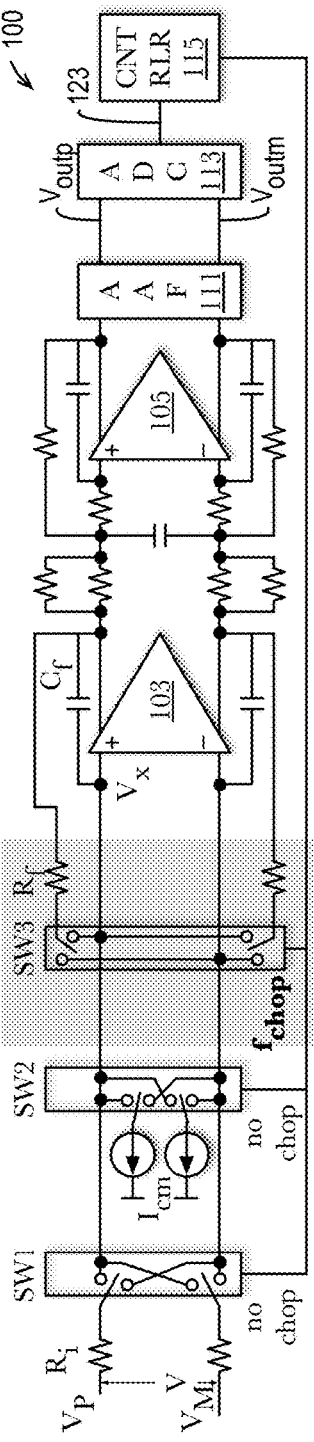

At decision block 214, if there are more differential element pairs whose mismatch-induced errors need to be measured, a next pair is selected as the current pair at block 216, and operation returns to block 204. For example, if the input resistor $R_i$ pair of FIG. 1 were chosen at block 202 as shown in FIG. 5A, then the feedback resistor $R_f$ pair could be chosen for the next iteration of blocks 204 through 212 as shown in FIG. 5B, and the current source pair $I_{cm}$ may be chosen for the third iteration as shown in FIG. 5C. The loop continues for all differential element pairs for which the mismatch-induced error is to be determined via the spectral separation method.

Figure 6:
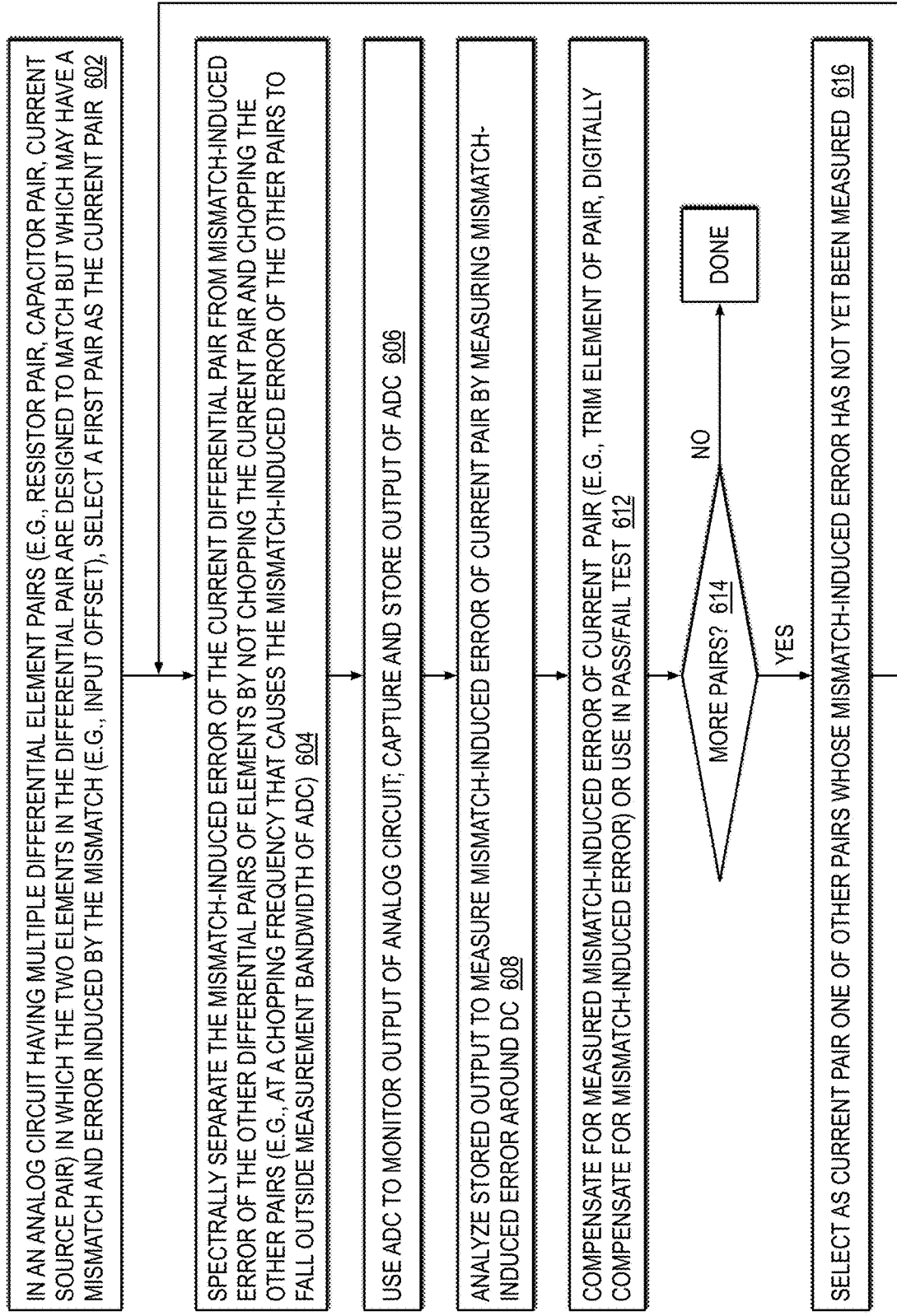
FIG. 6 is an example flowchart illustrating a method that uses spectral separation to measure a mismatch-induced error in a differential element pair in accordance with embodiments of the present disclosure.

FIG. 6 is an example flowchart illustrating a method, for use in a system having an analog circuit that has multiple differential element pairs in which each element in a pair is designed to match, that uses spectral separation to measure a mismatch-induced error in a differential element pair in accordance with embodiments of the present disclosure. The system 100 of FIG. 1 is an example of a system in which the method may be applied, although the method may be applied to measure differential element pair mismatch-induced error in any differential analog circuit. Operation begins at block 602.

At block 602, one of the differential element pairs is selected as the current pair whose mismatch-induced error is to be measured. For example, the input resistor $R_i$ pair may be selected as the current pair, although other pairs could be chosen. Operation proceeds to block 604.

Figure 7:
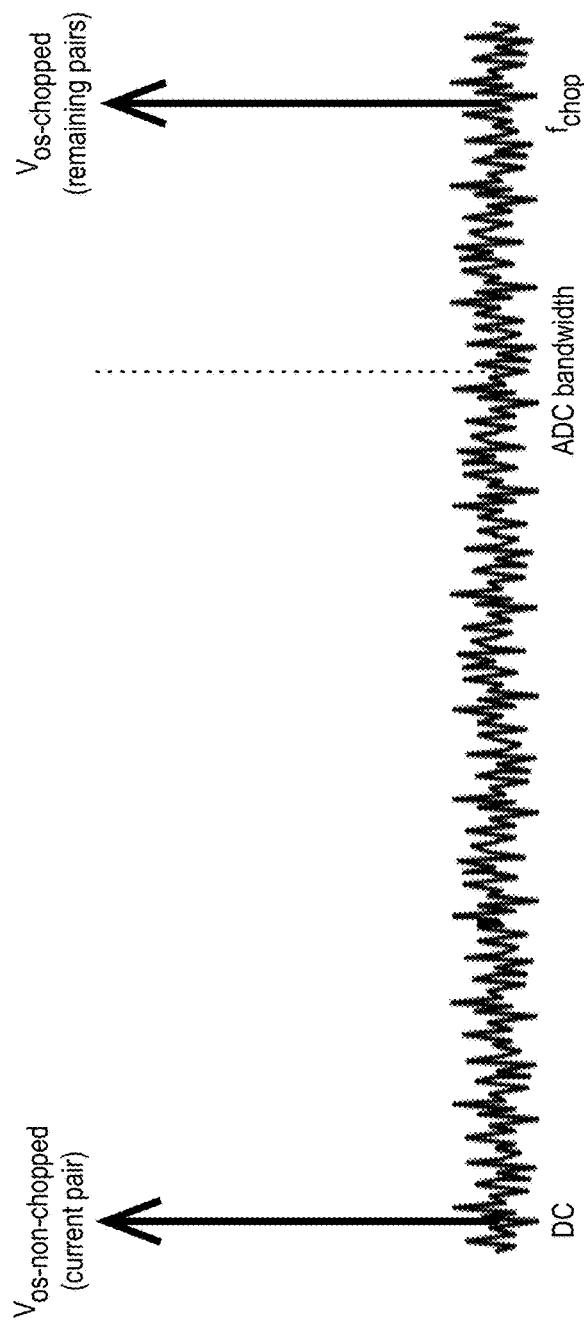
FIG. 7 is an example frequency spectrum graph illustrating operation of the method of FIG. 6.
Figure 8:
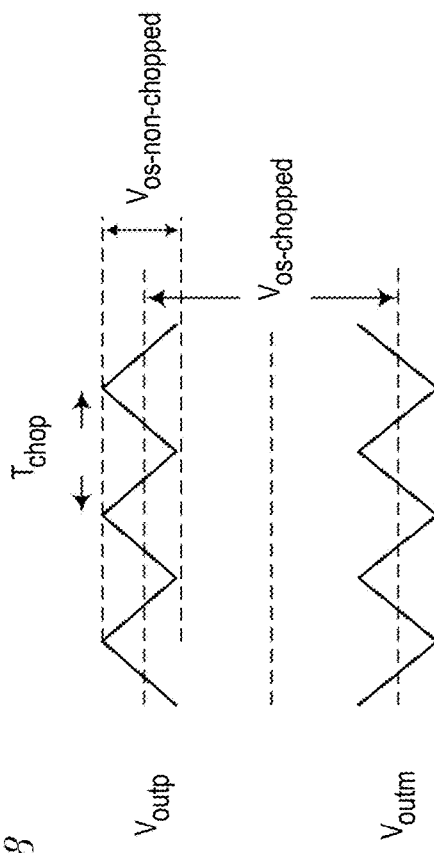
FIG. 8 is an example output voltage graph illustrating operation of the method of FIG. 6.

At block 604, the mismatch-induced error of the current pair is spectrally separated from the mismatch-induced error of the remaining differential element pairs of the circuit by not chopping the current pair and chopping the remaining pairs. Thus, the embodiment of FIG. 6 is effectively the inverse of the embodiment of FIG. 2. For example, if the input resistor $R_i$ pair is the current pair, then switch SW1 is not operated, i.e., kept in its default position, whereas the other switches SW2 and SW3 corresponding to the current sources $I_{cm}$ and to the feedback resistor $R_f$ are operated at a chopping frequency, as shown in FIG. 5A. Preferably, the chopping frequency at which the current pair is chopped is a frequency that is outside the measurement bandwidth of an ADC that monitors the output of the analog circuit while the spectral separation is being performed. In one embodiment, the ADC is an oversampling ADC. Preferably, the input signal of the analog circuit (e.g., in the input voltage V of FIG. 1) is set to zero (e.g., $V_P$ and $V_M$ are tied to ground or to a power supply voltage) while the spectral separation is performed. As a result of the spectral separation of the mismatch-induced error of the current pair from the mismatch-induced errors of the remaining pairs, the current pair mismatch-induced error remains as a frequency domain DC shift at the analog circuit output, whereas the mismatch-induced errors of the remaining pairs may be observed as a ripple at the analog circuit output around the chopping frequency used to chop the remaining pairs, as shown in FIGS. 7 and 8. The error may settle to its final value substantially within a time constant which, in the example of FIG. 1, may be the product of the feedback resistance and capacitance of the gain stage. Operation proceeds to block 606.

At block 606, the ADC monitors the output of the analog circuit, and the ADC output is captured and stored (e.g., in a memory accessible to a controller, e.g., controller 115 of FIG. 1, that captures the ADC output). Operation proceeds to block 608.

At block 608, the stored output is analyzed to measure the mismatch-induced error of the current pair. In one embodiment, a digital notch filter may be applied to the stored digital output around DC to measure the mismatch-induced error of the current pair. In one embodiment, a Fast Fourier Transform (FFT) may be applied to the stored digital output to measure the mismatch-induced error of the current pair around DC. In one embodiment, a peak-to-peak measurement of the stored digital output may be observed to measure the mismatch-induced error of the current pair. Operation proceeds to block 612.

At block 612, the measured mismatch-induced error of the current pair is compensated or used to make a product test pass/fail determination, similar to that described above with respect to block 212 of FIG. 2. Operation proceeds to decision block 614.

Figure 9A:
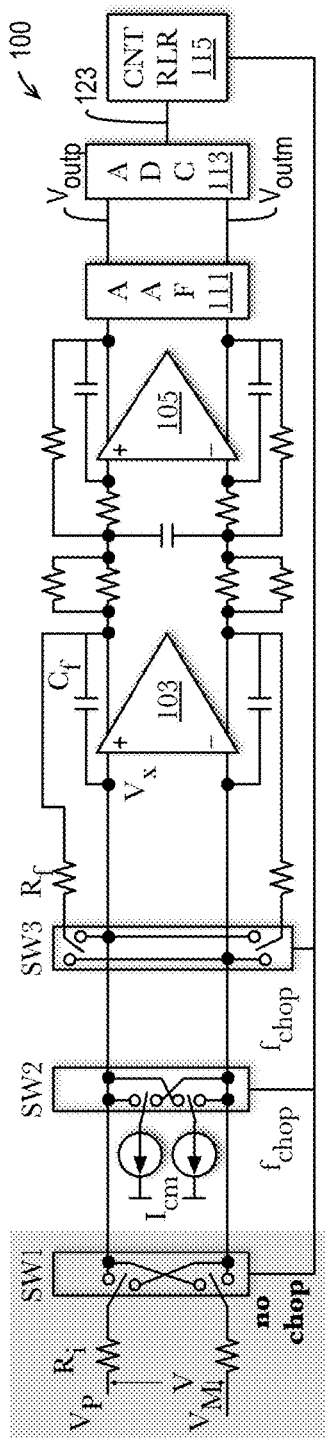
FIGS. 9A through 9C are examples of a system operating according to the method of FIG. 6.
Figure 9B:
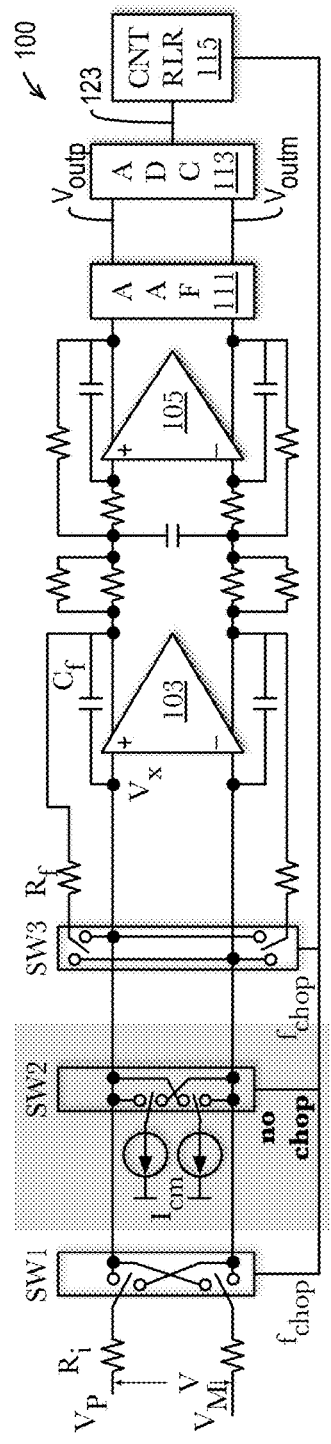
Figure 9C:
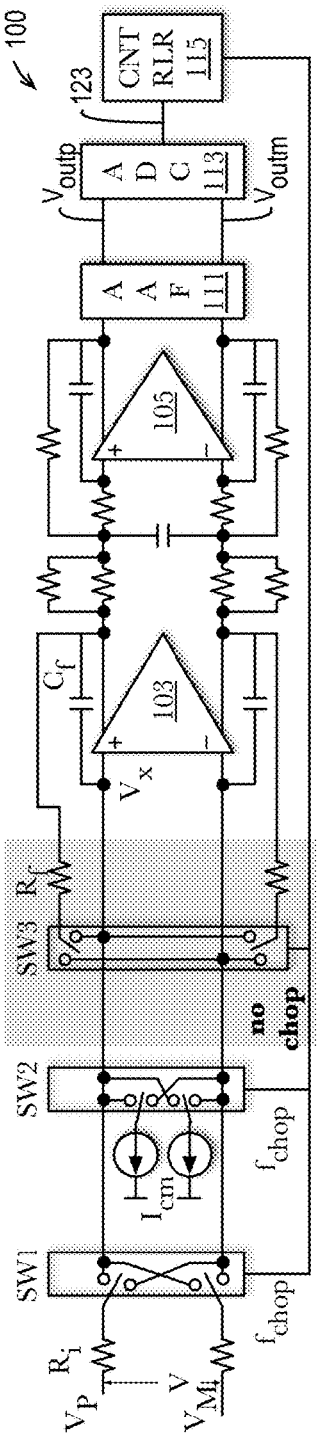

At decision block 614, if there are more differential element pairs whose mismatch-induced errors need to be measured, a next pair is selected as the current pair at block 616, and operation returns to block 604. For example, if the input resistor $R_i$ pair of FIG. 1 were chosen at block 602 as shown in FIG. 9A, then the feedback resistor $R_f$ pair could be chosen for the next iteration of blocks 604 through 612 as shown in FIG. 9B, and the current source pair $I_{cm}$ could be chosen for the third iteration as shown in FIG. 9C. The loop continues for all differential element pairs for which the mismatch-induced error is to be determined via the spectral separation method.

Figure 10:
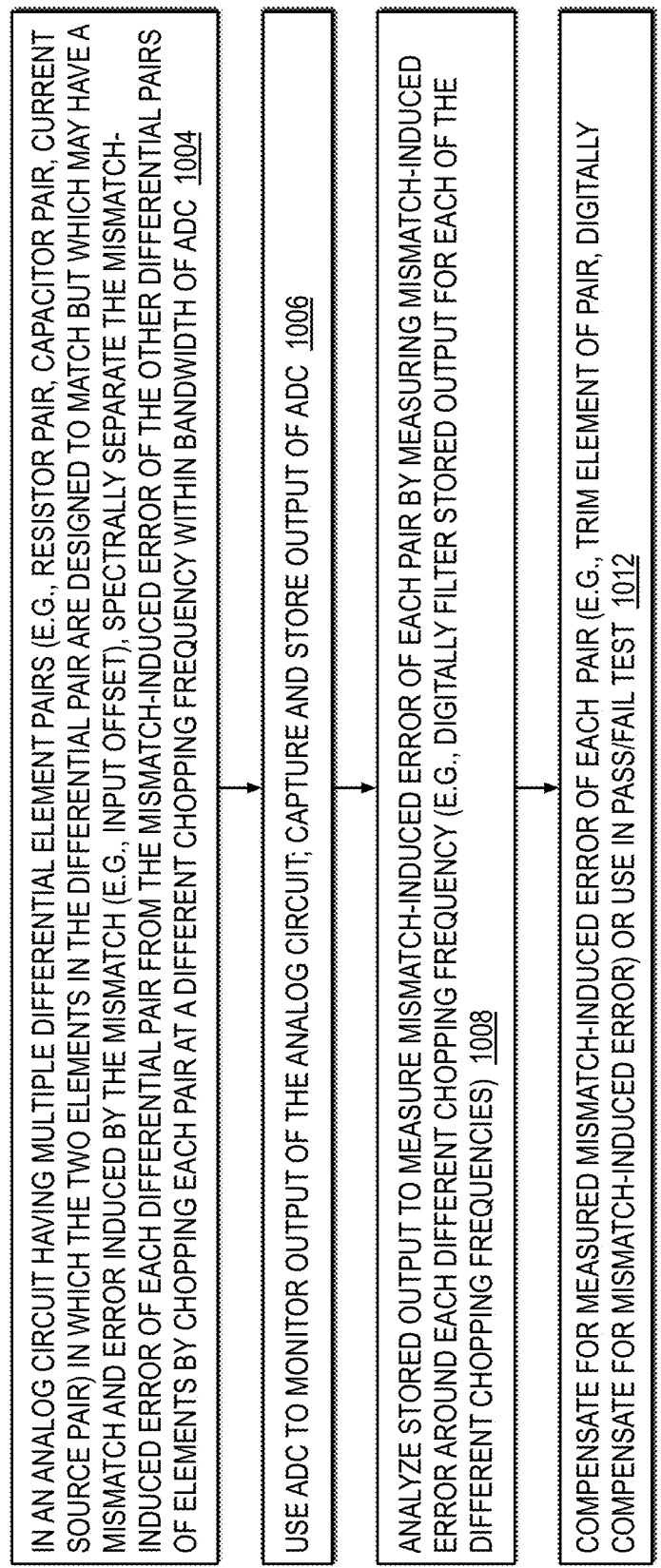
FIG. 10 is an example flowchart illustrating a method that uses spectral separation to measure a mismatch-induced error in a differential element pair in accordance with embodiments of the present disclosure.

FIG. 10 is an example flowchart illustrating a method, for use in a system having an analog circuit that has multiple differential element pairs in which each element in a pair is designed to match, that uses spectral separation to measure a mismatch-induced error in a differential element pair in accordance with embodiments of the present disclosure. The system 100 of FIG. 1 is an example of a system in which the method may be applied, although the method may be applied to measure differential element pair mismatch-induced error in any differential analog circuit. Operation begins at block 1004.

Figure 11:
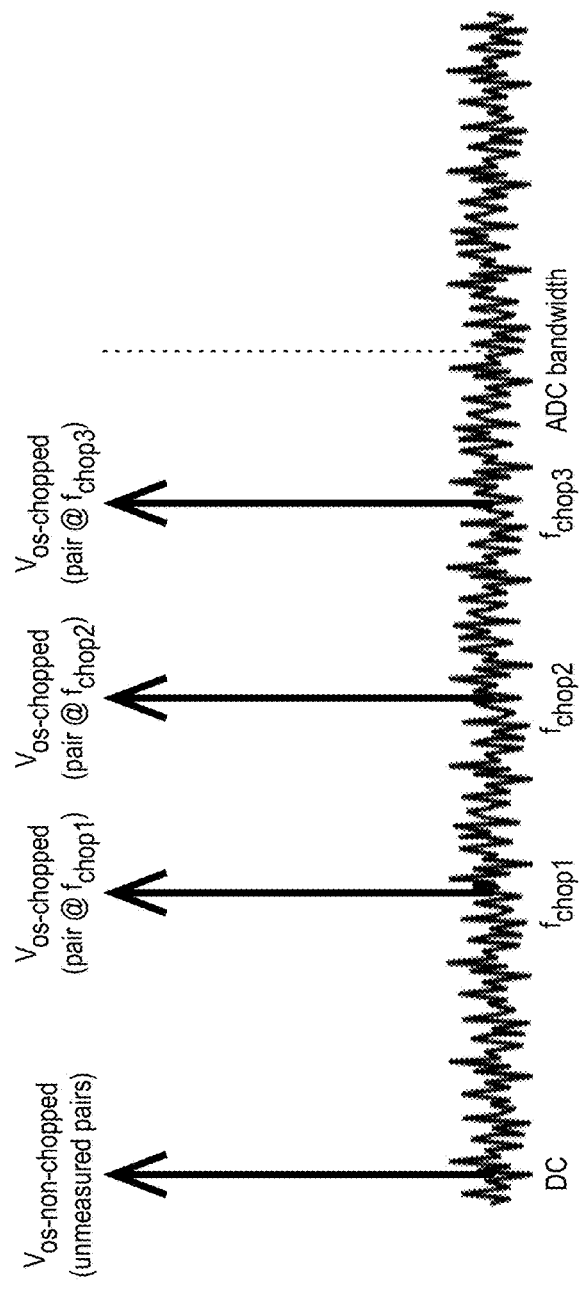
FIG. 11 is an example frequency spectrum graph illustrating operation of the method of FIG. 10.
Figure 12:
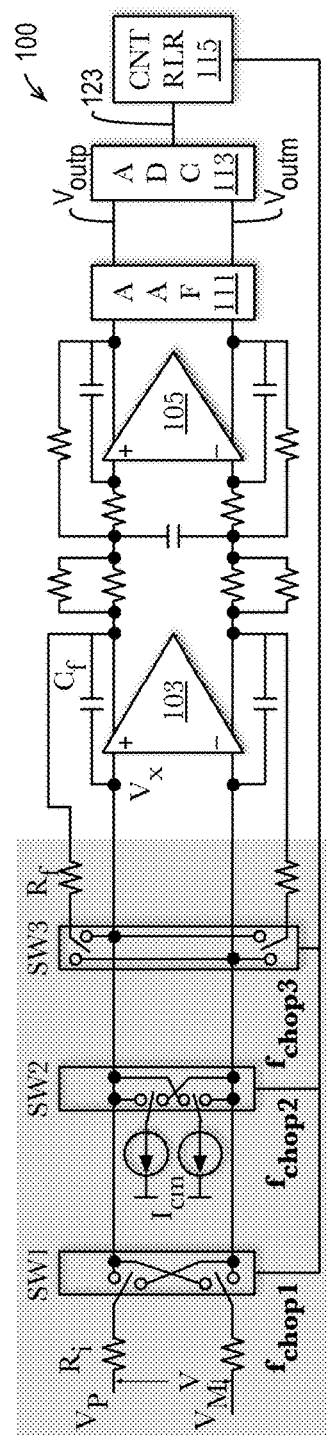
FIG. 12 is an example of a system operating according to the method of FIG. 10.

At block 1004, each pair of the differential element pairs whose mismatch-induced error is to be measured is chopped at a distinct chopping frequency within the bandwidth of the ADC in order to spectrally separate the mismatch-induced error of each chopped pair from the mismatch-induced error of the remaining differential element pairs of the circuit. For example, the input resistor $R_i$ pair may be chopped via switch SW1 at a first chopping frequency $F_{chop1}$, the current sources $I_{cm}$ pair may be chopped via switch SW2 at a second chopping frequency $F_{chop2}$, and the feedback resistor $R_f$ pair may be chopped via switch SW3 at a third chopping frequency $F_{chop3}$, as shown in FIGS. 11 and 12, in which $F_{chop1}$, $F_{chop2}$, and $F_{chop3}$ are distinct and sufficiently separated within the frequency spectrum such that the mismatch-induced error of each chopped pair are separately observable at the analog circuit output. As a result of the spectral separation of the mismatch-induced error of the each of the chopped pairs from the mismatch-induced errors of the remaining pairs, the mismatch-induced error of non-chopped differential element pairs remains as a frequency domain DC shift at the analog circuit output, whereas the mismatch-induced errors of the chopped pairs may be observed as a ripple at the analog circuit output around the distinct chopping frequency used to chop the respective pair, as shown in FIG. 11. Operation proceeds to block 1006.

At block 1006, the ADC monitors the output of the analog circuit, and the ADC output is captured and stored (e.g., in a memory accessible to a controller, e.g., controller 115 of FIG. 1, that captures the ADC output). Operation proceeds to block 1008.

At block 1008, the stored output is analyzed to measure the mismatch-induced error of each chopped pair. In one embodiment, multiple digital notch filters may be applied to the stored digital output around each of the chopping frequencies used at block 1004 to measure the mismatch-induced error of each pair. In one embodiment, a Fast Fourier Transform (FFT) may be applied to the stored digital output to measure the mismatch-induced error of each pair around each of the chopping frequencies used at block 1004. Operation proceeds to block 1012.

At block 1012, the measured mismatch-induced error of each pair measured at block 1008 is compensated or used to make a product test pass/fail determination, similar to that described above with respect to block 212 of FIG. 2.

Figure 13:
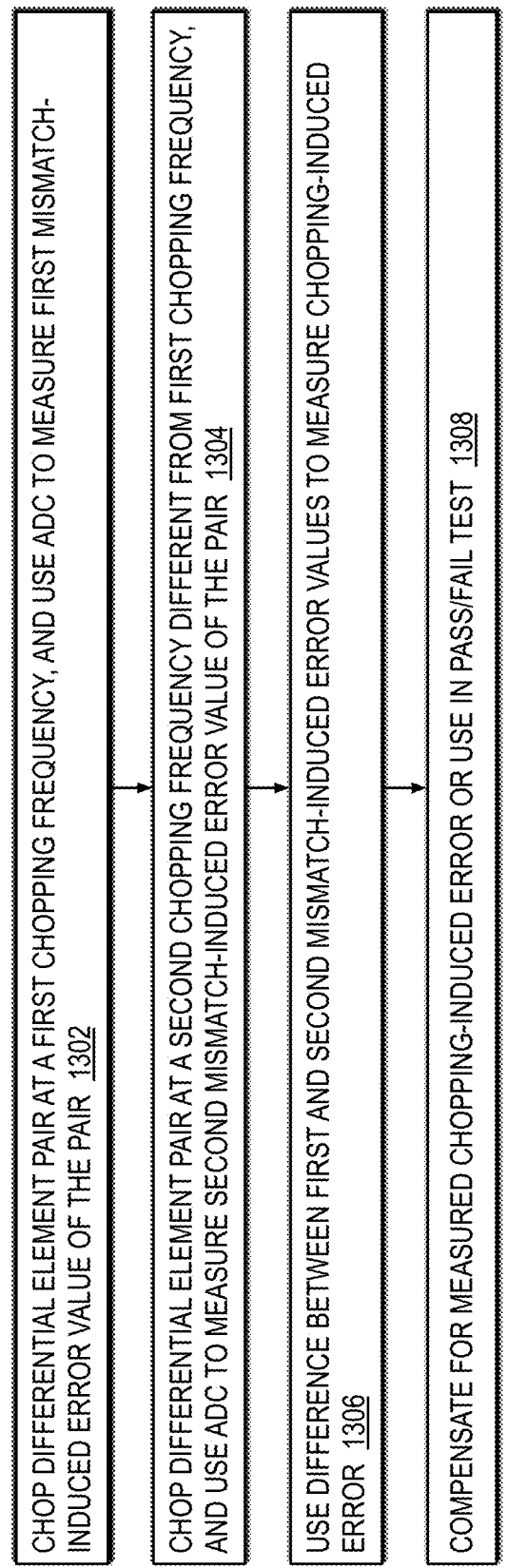
FIG. 13 is an example flowchart illustrating a method that measures chopping-induced error in accordance with embodiments of the present disclosure.

FIG. 13 is an example flowchart illustrating a method, for use in a system having an analog circuit that has at least one differential element pair in which each element in a pair is designed to match, that measures chopping-induced error in accordance with embodiments of the present disclosure. Causes of chopping-induced error may be switch-on resistance of the chopping switches, additional parasitic or coupling capacitance introduced by the chopping switches, among others. The system 100 of FIG. 1 is an example of a system in which the method may be applied, although the method may be applied to measure chopping-induced error in any analog circuit. The method may be used in conjunction with any of the embodiments described above for measuring mismatch-induced error of differential element pairs. Additionally, the method may be used to measure chopping-induced error in other applications in which chopping is employed, e.g., in conjunction with a conventional chopping application that chops the differential element pairs and filters the frequency-shifted output. Operation begins at block 1302.

At block 1302, a differential element pair (e.g., the input resistor $R_i$ pair of FIG. 1) is chopped at a first chopping frequency (e.g., via switch SW1) similar to the operation at block 204 of FIG. 2, and an ADC (e.g., ADC 113 of FIG. 1) is used to measure the first mismatch-induced error value of the pair similar to the operation at blocks 206 and 208 of FIG. 2. Operation proceeds to block 1304.

At block 1304, the differential element pair of block 1302 is chopped at a second chopping frequency distinct from the first chopping frequency used at block 1302, and the ADC is used to measure a second mismatch-induced error value of the pair. Operation proceeds to block 1306.

At block 1306, a difference between the first and second mismatch-induced error values is computed and used to measure a chopping-induced error. Operation proceeds to block 1308.

At block 1308, the measured chopping-induced error of the pair is compensated. In one embodiment, the compensation comprises digitally compensating for the chopping-induced error. For example, the measured chopping-induced error value may be stored during test of the system and subsequently, during normal operation of the system, subtracted from the ADC output. Alternatively, rather than compensating, the measured mismatch-induced error may be used to make a pass/fail determination during product test of an integrated circuit that includes the analog circuit. For example, if the chopping-induced error exceeds a threshold, the integrated circuit may fail the test.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A method for use in an analog circuit having a plurality of differential pairs of elements, wherein for each pair of the plurality of differential pairs of elements, the elements of the pair are designed to match but may have mismatch that induces error, comprising:
   for each pair of at least two pairs of the plurality of differential pairs of elements:
      spectrally separating the mismatch-induced error of the pair from mismatch-induced error of a remainder of the plurality of differential pairs of elements;
      monitoring, by an analog-to-digital converter (ADC), an output of the analog circuit; and
      analyzing the monitored output to measure the mismatch-induced error of the pair.

2. The method of claim 1,
   wherein said spectrally separating the mismatch-induced error of the pair comprises chopping the pair and not chopping the remainder of the plurality of differential pairs.

3. The method of claim 2,
   wherein said analyzing the monitored output to measure the mismatch-induced error of the pair comprises measuring the monitored output around a frequency at which the pair is chopped.

4. The method of claim 1,
   wherein said spectrally separating the mismatch-induced error of the pair comprises not chopping the pair and chopping the remainder of the plurality of differential pairs.

5. The method of claim 4,
   wherein a frequency at which said chopping the remainder of the plurality of differential pairs is performed is a frequency that causes the mismatch-induced error of the remainder to fall outside a measurement bandwidth of the ADC.

6. The method of claim 1,
   wherein each of the at least two pairs are simultaneously chopped at distinct chopping frequencies to perform said spectrally separating the mismatch-induced error of the pair;
   wherein all of the distinct chopping frequencies are within a measurement bandwidth of the ADC; and wherein said analyzing the monitored output to measure the mismatch-induced error of the pair comprises digitally filtering the monitored output around each of the distinct chopping frequencies.

7. The method of claim 1, further comprising:
compensating for the measured mismatch-induced error of the pair of at least one pair of the at least two pairs of the plurality of differential pairs of elements.

8. The method of claim 1,
wherein said analyzing the monitored output to measure the mismatch-induced error of the pair is performed for the at least two pairs in sequence; and
compensating for the measured mismatch-induced error of the pair in the sequence after each mismatch-induced error is measured.

9. The method of claim 1, further comprising:
making a pass/fail determination for an integrated circuit that includes the analog circuit based on whether the measured mismatch-induced error exceeds a threshold.

10. The method of claim 1,
wherein the mismatch-induced error of the pair comprises an input offset of a gain stage of the analog circuit.

11. The method of claim 1,
wherein the method is performed during a calibration stage of a product test of the analog circuit.

12. The method of claim 1,
wherein the method is performed during an idle mode of operation of the analog circuit.

13. The method of claim 1,
wherein the method is performed during normal operation of the analog circuit.

14. An apparatus, comprising:
an analog circuit having a plurality of differential pairs of elements, wherein for each pair of the plurality of differential pairs of elements, the elements of the pair are designed to match but may have mismatch that induces error;
an analog-to-digital converter (ADC) configured to monitor an output of the analog circuit; and
a controller configured to, for each pair of at least two pairs of the plurality of differential pairs of elements:
spectrally separate the mismatch-induced error of the pair from mismatch-induced error of a remainder of the plurality of differential pairs of elements; and
analyze the monitored output to measure the mismatch-induced error of the pair.

15. The apparatus of claim 14,
wherein the controller spectrally separates the mismatch-induced error of the pair by controlling chopping switches to chop the pair and to not chop the remainder of the plurality of differential pairs.

16. The apparatus of claim 15,
wherein the controller analyzes the monitored output to measure the mismatch-induced error of the pair by measuring the monitored output around a frequency at which the pair is chopped.

17. The apparatus of claim 14,
wherein the controller spectrally separates the mismatch-induced error of the pair by controlling chopping switches to not chop the pair and to chop the remainder of the plurality of differential pairs.

18. The apparatus of claim 17,
wherein a frequency at which the remainder of the plurality of differential pairs is chopped is a frequency that causes the mismatch-induced error of the remainder to fall outside a measurement bandwidth of the ADC.

19. The apparatus of claim 14,
wherein the controller spectrally separates the mismatch-induced error of the pair by controlling chopping switches to simultaneously chop each of the at least two pairs at distinct chopping frequencies;
wherein all of the distinct chopping frequencies are within a measurement bandwidth of the ADC; and
wherein the controller analyzes the monitored output to measure the mismatch-induced error of the pair by digitally filtering the monitored output around each of the distinct chopping frequencies.

20. The apparatus of claim 14,
wherein the controller is further configured to compensate for the measured mismatch-induced error of the pair.

21. The apparatus of claim 14,
wherein the mismatch-induced error of the pair comprises an input offset of a gain stage of the analog circuit.

22. A method for use in an analog circuit having at least one differential pair of elements, wherein for each pair of the at least one differential pair of elements, the elements of the pair are designed to match but may have mismatch that induces error, comprising:
measuring, using an analog-to-digital converter (ADC), a first value of the mismatch of the pair at a first chopping frequency;
measuring, using the ADC, a second value of the mismatch of the pair at a second chopping frequency distinct from the first chopping frequency; and
measuring a chopping-induced error based on a difference between the first and second values of the mismatch of the pair.

23. The method of claim 22, further comprising:
compensating for the measured chopping-induced error.

24. The method of claim 22, further comprising:
making a pass/fail determination for an integrated circuit that includes the analog circuit based on whether the measured chopping-induced error exceeds a threshold.

* * * * *